[19] United States Patent
Yang

[10] Patent No.: US 6,369,735 B1
[45] Date of Patent: Apr. 9, 2002

[54] DIGITAL-TO-ANALOG CONVERTER WITH HIGH DYNAMIC RANGE

[75] Inventor: Hong Kui Yang, San Diego, CA (US)

[73] Assignee: LSI Logic Corporation, Milpitas, CA (US)

[*] Notice: Subject to any disclaimer, the term of this patent is extended or adjusted under 35 U.S.C. 154(b) by 0 days.

[21] Appl. No.: 09/676,516

[22] Filed: Oct. 2, 2000

[51] Int. Cl.[7] .............................................. H03M 1/66
[52] U.S. Cl. ...................... 341/144; 341/143; 455/450
[58] Field of Search ........................ 341/76, 143, 144; 455/450

[56] References Cited

U.S. PATENT DOCUMENTS

| | | | | |
|---|---|---|---|---|
| 5,196,850 A | * | 3/1993 | Duffy et al. | 341/76 |
| 6,167,273 A | * | 12/2000 | Mandyam | 455/450 |
| 6,271,782 B1 | * | 8/2001 | Steensgaard-Madsen | 341/143 |
| 6,292,122 B1 | * | 9/2001 | Younis et al. | 341/143 |

* cited by examiner

Primary Examiner—Michael Tokar
Assistant Examiner—Jean Bruner Jeanglaude
(74) Attorney, Agent, or Firm—Trexler, Bushnell, Giangiorgi & Blackstone, Ltd.

[57] ABSTRACT

A digital-to-analog converter that is configured to implement a scaling scheme wherein a signal level is digitally scaled before a digital-to-analog converter, and is scaled back in the analog stage of the digital-to-analog converter. The scaling normalizes the input mean power to the digital-to-analog converter. Therefore, the digital-to-analog converter has a generally constant power and no extra dynamic range is needed. Preferably, the device is configured to receive fundamental, dedicated, supplemental and pilot channels, and is configured to combine the four channels to form a single signal. The single signal is then received by a gain scaler, a shaping filter, a digital-to-analog converter, and an analog filter. The gain scaler receives the signal, and applies a first gain thereto. Then, the shaping filter receives the signal, and the signal then travels to the digital-to-analog converter wherein a second gain is applied to the signal. Preferably, the second gain is inversely proportional to the first gain, thereby providing that the signal level is digitally scaled before the digital-to-analog converter and is scaled back in the analog stage of the digital-to-analog converter. The signal then preferably travels to the analog filter. The device is configured such that a digital signal processor (DSP) communicates with the gain scaler to control the first gain and communicates with the digital-to-analog converter to control the second gain.

8 Claims, 1 Drawing Sheet

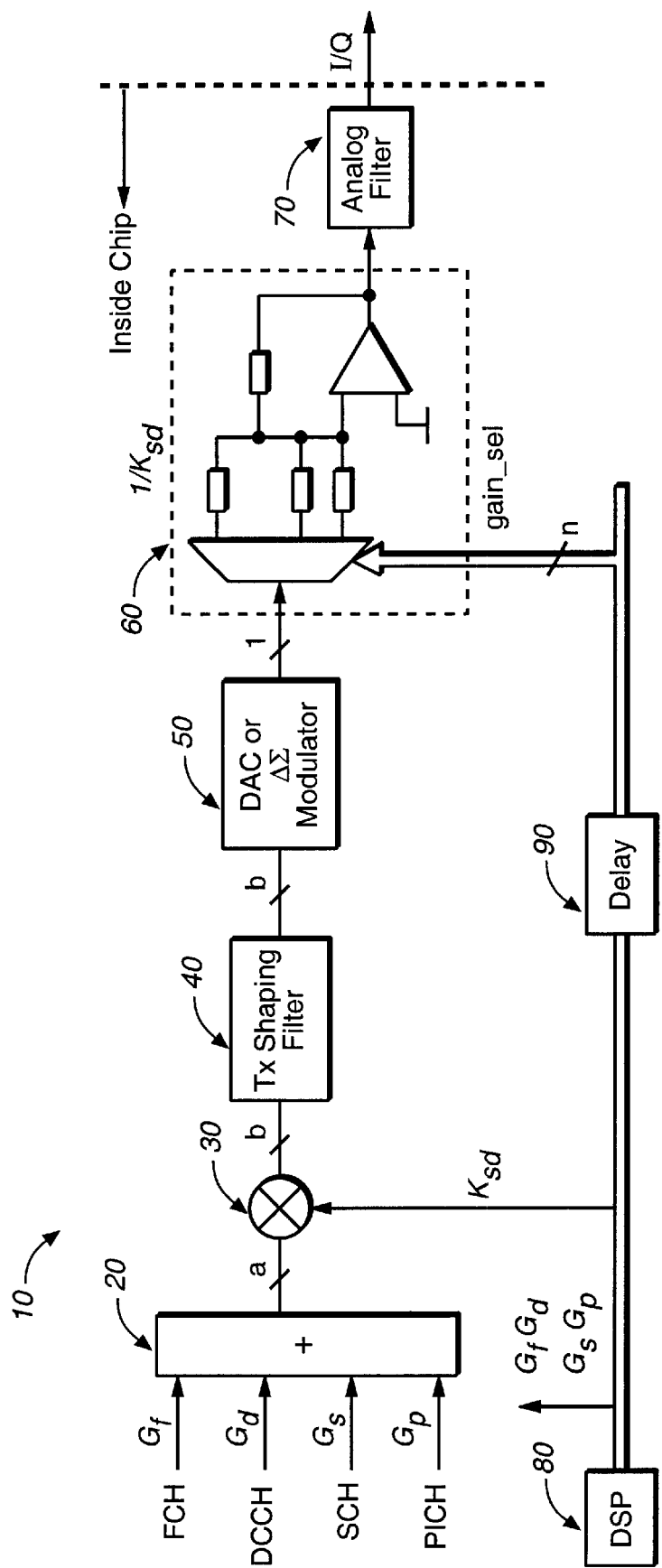
FIG._1

DIGITAL-TO-ANALOG CONVERTER WITH HIGH DYNAMIC RANGE

FIELD OF THE INVENTION

The present invention relates generally to digital-to-analog converters, and more specifically relates to a digital-to-analog converter which has high dynamic range.

BACKGROUND OF THE INVENTION

Code-Division Multiple Access (CDMA) is a digital cellular technology that uses spread-spectrum techniques. Unlike competing systems, such as Global System for Mobile Communications (GSM), that use time-division multiplexing (TDM), CDMA does not assign a specific frequency to each user. Instead, every channel uses the full available spectrum. Individual conversations are encoded with a pseudo-random digital sequence.

CDMA started out as a military technology, first used during World War II by the English allies to foil German attempts at jamming transmissions. The allies decided to transmit over several frequencies, instead of one, making it difficult for the Germans to pick up the complete signal.

In third generation CDMA, the transmit signal waveform is continuous in the reverse link. As a result, the signal power is varied with the data rate. The variation is on a frame basis (i.e., 80/40/20/5 milliseconds in an IS-2000 CDMA wireless communication system) and might be changed by, for example, more than 20 dB for a 1×IS-2000 system and even higher for a 3×+IS-2000 system. This extra dynamic range imposes a tighter requirement for the transmit digital-to-analog converter. This requirement translates directly to, for example, an extra 3 to 4 bits for 1×CDMA.

One approach at solving the problem is to increase the number of bits for the digital-to-analog converter. This might, for example, require a 12–14 bit digital-to-analog converter for a 1×CDMA system and over 14 bits for a 3×+CDMA system. However, it is advantageous to avoid increasing the number of bits for a digital-to-analog converter because doing so complicates the implementation and substantially increases the power consumption, die size, cost, etc.

OBJECTS AND SUMMARY

It is an object of an embodiment of the present invention to provide a digital-to-analog converter which has high dynamic range.

Another object of an embodiment of the present invention is to increase the dynamic range of a digital-to-analog converter without increasing the number of bits.

Still another object of an embodiment of the present invention is to provide a digital-to-analog converter which is configured to digitally scale the signal level before the digital-to-analog conversion, and then scale it back in the analog stage of the converter.

Briefly, and in accordance with at least one of the foregoing objects, an embodiment of the present invention provides a device that is configured to implement a novel scaling scheme wherein a signal level is digitally scaled before a digital-to-analog converter, and is scaled back in the analog stage of the digital-to-analog converter. The scaling normalizes the input mean power to the digital-to-analog converter. Therefore, the digital-to-analog converter has a generally constant power and no extra dynamic range is needed.

Preferably, the device which is configured to provide the scaling scheme is configured to receive fundamental, dedicated, supplemental and pilot channels, and is configured to combine the four channels to form a single signal. The single signal is then received by a gain scaler, a shaping filter, a digital-to-analog converter, and an analog filter of the device. Specifically, the gain scaler receives the signal, and applies a first gain thereto. The shaping filter then receives the signal, and the signal then travels to the digital-to-analog converter wherein a second gain is applied to the signal. Preferably, the second gain is inversely proportional to the first gain, thereby providing that the signal level is digitally scaled before the digital-to-analog converter and is scaled back in the analog stage of the digital-to-analog converter. The signal then preferably travels to the analog filter. The device is configured such that a digital signal processor (DSP) communicates with the gain scaler to control the first gain and communicates with the digital-to-analog converter to control the second gain.

BRIEF DESCRIPTION OF THE DRAWING

The present invention and the advantages thereof will become more apparent upon consideration of the following detailed description when taken in conjunction with the accompanying drawing of which FIG. 1 is a schematic diagram of a device configured to implement a scaling scheme in accordance with an embodiment of the present invention.

DESCRIPTION

While the invention may be susceptible to embodiment in different forms, there is shown in the drawings, and herein will be described in detail, a specific embodiment with the understanding that the present disclosure is to be considered an exemplification of the principles of the invention, and is not intended to limit the invention to that as illustrated and described herein.

Shown in FIG. 1 is a device (specifically, a digital-to-analog converter 10) which is configured to digitally scale a signal level before the digital-to-analog conversion, and is configured to scale the signal back in the analog stage of the conversion. The scaling normalizes the input mean power to the digital-to-analog converter. Therefore, the digital-to-analog converter has a generally constant power and no extra dynamic range is needed.

In order to calculate the scaling factor, a reference is needed. As shown in FIG. 1, the digital-to-analog converter preferably receives a plurality of input channels. FIG. 1 shows the digital-to-analog converter being used in IS-2000 wherein the digital-to-analog converter receives fundamental, dedicated, supplemental and pilot channels. The reference may be the mean square signal of one of the input channels. Specifically, preferably the reference used is the mean square signal of the pilot channel, which also represents the minimum signal level in the transmit (Tx) configuration. Assuming that the mean square value of the Tx signal for the pilot only channel at the digital-to-analog converter input is a to be determined dB back off from the peak full scale, the scaling factor for RC 3, 4 or 5 in IS-2000 is defined as:

$$K_s = G_p/(G_f^2 + G_d^2 + G_s^2 + G_p^2)^{1/2} \tag{1}$$

where G denotes the gain, and subscripts f, d, s and p denote fundamental, dedicated, supplemental and pilot channel, respectively. All the code channel gains are relative to the pilot channel.

At the input of the digital-to-analog converter 10, the four channels are combined to form a single signal ("a"), and the single signal is scaled by a factor corresponding to $K_s$ (equation 1). Then, at the output, the signal is re-scaled by a factor of $1/K_s$. Preferably, to avoid infinite steps in analog gain stage, the scaling factor which is used is a discrete value $K_{sd}$ in practice with x dB step size. Thus, the extra range dynamic range required of the digital-to-analog converter 10 with a discrete scaling gain scheme is x dB. Hence, as shown in FIG. 1, the single signal "a" is first scaled by a factor of $K_{sd}$ (thereby providing signal "b" as shown in FIG. 1), and then later re-scaled by a factor of $1/K_{sd}$.

As shown, the digital-to-analog converter 10 preferably includes a gain controller/channel combiner 20, a gain scaler 30, a Tx Shaping Filter 40, a digital-to-analog converter (DAC) or delta-sigma (ΔΣ) Modulator 50 a digital-to-analog converter (DAC) 60 which is preferably a 1-bit DAC, and an Analog Filter 70.

FIG. 1 only shows half the path (either I or Q). Due to complex despreading, all code channels (i.e. fundamental, dedicated, supplemental and pilot) appear at either the I or Q path. After gain control, all channels are combined to form a single channel "a" (i.e. by the gain controller/channel combiner 20). This single signal is varied in power level. Then, the gain scaler 30 is applied to the signal (thereby providing signal "b"). Then, the signal "b" goes through the Tx Shaping Filter 40, which is preferably configured to take advantage of the reduced bandwidth. Subsequently, the signal travels through the DAC or ΔΣ Modulator 50, the 1-bit DAC 60 and the Analog Filter 70, wherein the Analog Filter 70 is used for smoothing (i.e. glitches created by the DAC and discrete gain stage).

As shown, a digital signal processor (DSP) 80 is responsible for the channel gain and scaling gain update, and provides the gain selection ("gain_sel") for the 1-bit DAC 60. The discrete gains are implemented as a relative ratio and hence is accurate (~1%). The delay element 90 shown in FIG. 1 is to count the filter, DAC (delta-sigma) and pipelined delays to align the time applying digital and analog gains.

The device 10 shown in FIG. 1 is advantageous because the dynamic range can be generally arbitrarily increased, the complexity of the Tx Shaping Filter 40 can be reduced because the bitwidth is small and no extra gain stage is required with the delta-sigma modulator DAC. The device 10 is not complex, has a relatively low power consumption, has a relatively small die size, and is generally "invisible" outside of chip.

While an embodiment of the present invention is shown and described, it is envisioned that those skilled in the art may devise various modifications of the present invention without departing from the spirit and scope of the appended claims.

What is claimed is:

1. A digital-to-analog converter which is configured to implement a scaling scheme wherein a signal level is digitally scaled before a digital-to-analog conversion and is scaled back after the conversion, thereby providing that the input mean power to the digital-to-analog converter is generally normalized, said digital-to-analog converter comprising a gain scaler, a Tx shaping filter connected to the gain scaler, at least one of a DAC and ΔΣ modulator connected to the Tx shaping filter, a 1-bit DAC connected to the modulator, and an analog filter connected to the 1-bit DAC, wherein said digital-to-analog converter is configured to control a gain of the gain scaler and a gain selection of the 1-bit DAC such that signal level is digitally scaled before a digital-to-analog conversion and is scaled back after the conversion and the input mean power to the digital-to-analog converter is generally normalized.

2. A digital-to-analog converter as recited in claim 1, further comprising a digital signal processor in communication with said gain scaler and said 1-bit DAC, said digital signal processor configured to control the gain scaler and provide gain selection to the 1-bit DAC.

3. A digital-to-analog converter as recited in claim 1, wherein said digital-to-analog converter is configured to receive a plurality of input channels and is configured to combine the channels into a single signal.

4. A digital-to-analog converter as recited in claim 3, wherein said digital-to-analog converter is configured to apply a first gain to the single signal.

5. A digital-to-analog converter as recited in claim 4, wherein said digital-to-analog converter includes an analog stage and is configured to apply a second gain to the single signal during the analog stage, wherein the second gain is inversely proportional to the first gain.

6. A digital-to-analog converter which is configured to implement a scaling scheme wherein a level of a single signal is digitally scaled before a digital-to-analog conversion and is scaled back after the conversion, said digital-to-analog converter configured to receive a plurality of input channels and is configured to combine the channels into the single signal, wherein said digital-to-analog converter is configured to apply a first gain to the single signal and subsequently apply a second gain to the single signal, wherein the second gain is inversely proportional to the first gain, said digital-to-analog converter comprising a gain scaler, a Tx shaping filter connected to the gain scaler, at least one of a DAC and ΔΣ modulator connected to the Tx shaping filter, a 1-bit DAC connected to the modulator, and an analog filter connected to the 1-bit DAC, wherein said digital-to-analog converter is configured to control a gain of the gain scaler and a gain selection of the 1-bit DAC such that the signal level is digitally scaled before a digital-to-analog conversion and is scaled back after the conversion and the input mean power to the digital-to-analog converter is generally normalized.

7. A digital-to-analog converter as recited in claim 6, further comprising a digital signal processor in communication with said gain scaler and said 1-bit DAC, said digital signal processor configured to control the gain scaler and provide gain selection to the 1-bit DAC.

8. A method of converting a digital signal to analog, said method comprising implementing a scaling scheme wherein a signal level is digitally scaled before a digital-to-analog conversion and is scaled back after the conversion, further comprising applying a first gain before the conversion and applying a second gain after the conversion, wherein the first gain and second gain are such that the input mean power to the digital-to-analog converter is generally normalized.

* * * * *